(12) United States Patent
Xu

(10) Patent No.: US 12,182,433 B2
(45) Date of Patent: Dec. 31, 2024

(54) ADAPTIVE MEMORY PARTITION CLOSURE TIME

(71) Applicant: Micron Technology, Inc., Boise, ID (US)

(72) Inventor: Zhongguang Xu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 17/892,581

(22) Filed: Aug. 22, 2022

(65) Prior Publication Data

US 2024/0061601 A1 Feb. 22, 2024

(51) Int. Cl.
*G06F 3/06* (2006.01)

(52) U.S. Cl.
CPC ............ *G06F 3/0644* (2013.01); *G06F 3/064* (2013.01); *G06F 3/0679* (2013.01); *G06F 3/0604* (2013.01)

(58) Field of Classification Search
CPC .................. G06F 3/0644; G06F 3/0604; G06F 2212/7204
See application file for complete search history.

(56) References Cited

U.S. PATENT DOCUMENTS

| | | | | |
|---|---|---|---|---|
| 2013/0326314 A1* | 12/2013 | Choi | ................. | H03M 13/3784 714/780 |
| 2019/0107959 A1* | 4/2019 | Papandreou | .......... | G06F 3/0619 |
| 2021/0334032 A1* | 10/2021 | Parker | ................... | G06F 3/0604 |
| 2023/0110401 A1* | 4/2023 | Zheng | ...................... | G06N 3/08 711/154 |

OTHER PUBLICATIONS

Pletka et al. "Health-binning: Maximizing the performance and the endurance of consumer-level NAND flash." Proceedings of the 9th ACM International on Systems and Storage Conference. 2016. [retrieved from internet Feb. 25, 2020][<URL:https://dl.acm.org/doi/pdf/10.1145/2928275.2928279>] (Year: 2016).*

* cited by examiner

*Primary Examiner* — David Yi
*Assistant Examiner* — Nicholas A. Paperno
(74) *Attorney, Agent, or Firm* — Schwegman Lundberg & Woessner, P.A.

(57) ABSTRACT

Aspects of the present disclosure configure a system component, such as a memory sub-system controller, to perform adaptive read level threshold voltage operations. The controller determines a memory reliability value associated with an individual portion of the set of memory components and selects a partition closing time for the individual portion of the set of memory components based on the memory reliability value. The controller defines a partition of the individual portion of the set of memory components based on the partition closing time and associates the partition with a bin of a plurality of bins, each of the plurality of bins representing an individual read level threshold voltage against which a charge distribution of data stored in the individual portion of the set of memory components is compared to determine one or more logical values.

20 Claims, 6 Drawing Sheets

| PEC | 0 | 1-2000 | 2001-4000 | >4000 |
|---|---|---|---|---|
| CLOSING TIME | 4 hours | 3 hours | 2 hours | 1 hour |

FIG. 3

| PEC | Bin 1 | Bin 2 | Bin 3 | Bin 4 |
|---|---|---|---|---|
| 0 | 60 min | 2 hours | 4 hours | 10 hours |
| 1-2000 | 45 min | 1.5 hours | 2 hours | 3 hour |
| 2001-4000 | 30 min | 1 hours | 1.5 hours | 2.5 hour |
| >4000 | 15 min | 30 min | 1 hour | 1.5 hour |

FIG. 4

ADAPTIVE MEMORY PARTITION CLOSURE TIME

TECHNICAL FIELD

Embodiments of the disclosure relate generally to memory sub-systems and, more specifically, to performing adaptive memory read level threshold operations in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 3 is a block diagram of an example closing timetable, in accordance with some implementations of the present disclosure.

FIG. 4 is a block diagram of an example scan frequency table, in accordance with some implementations of the present disclosure.

DETAILED DESCRIPTION

Figure 1:
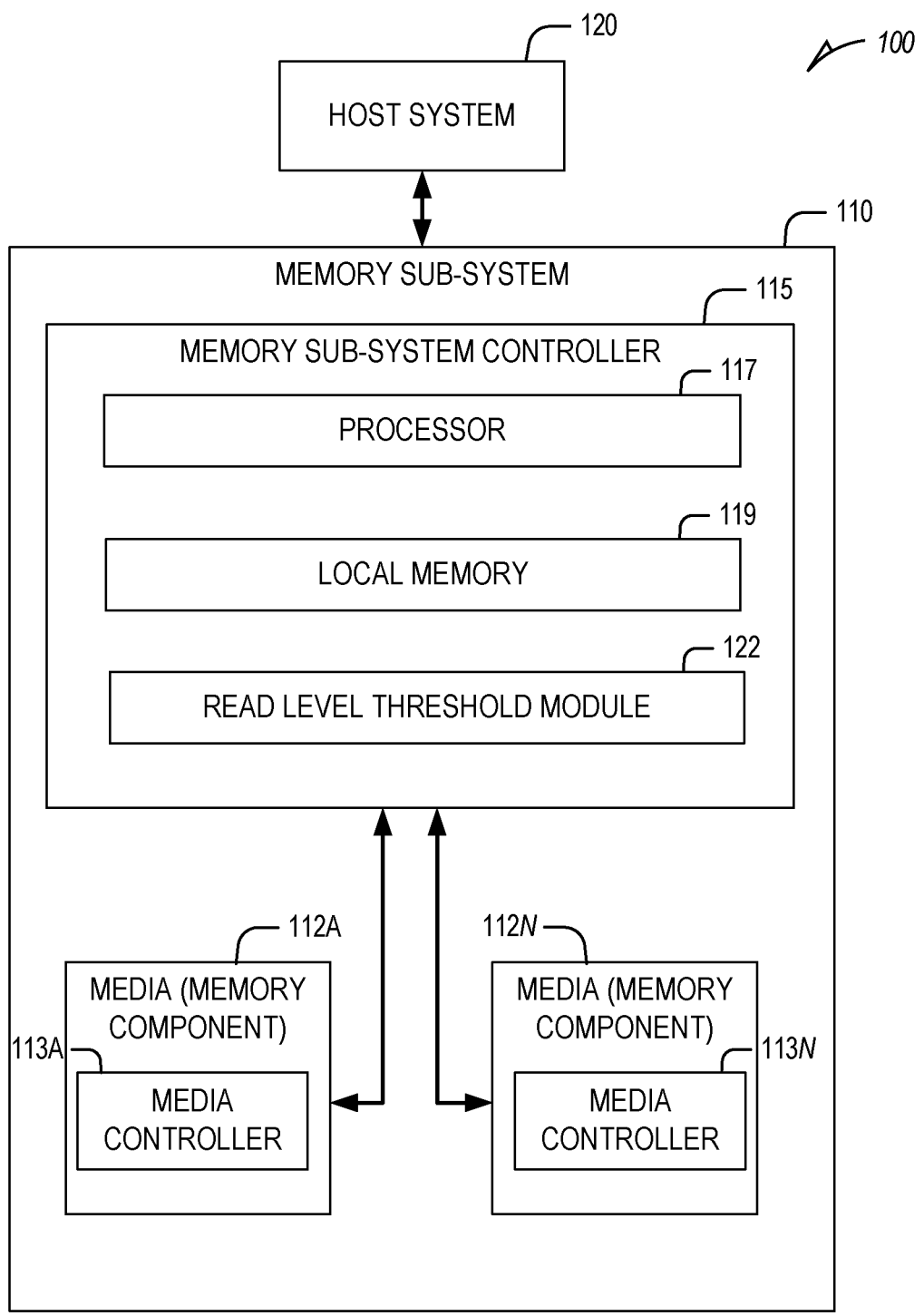
FIG. 1 is a block diagram illustrating an example computing environment including a memory sub-system, in accordance with some embodiments of the present disclosure.

Aspects of the present disclosure configure a system component, such as a memory sub-system controller, to performing adaptive read level threshold voltage operations for a memory sub-system. The memory sub-system controller can tailor when partitions of different portions of a set of memory components are closed based on memory reliability values of the portions, such as a quantity of program-erase (PE) cycles of the portions and/or an age of the portions. The partitions can be associated with different bins, each of which represents an individual read level threshold voltage against which charge distribution of data stored in the portion is compared to determine one or more logical values. In this way, the duration of time that data can be written to a portion of the set of memory components before the bin (e.g., representing read level threshold voltage) associated with the portion is updated is controlled on the basis of the memory reliability value of the portion. This can reduce the number of PE cycles that are performed for the portion and improve the efficiency at which data is stored which improves the overall efficiency of operating the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can send access requests (e.g., write command, read command, sequential write command, sequential read command) to the memory sub-system, such as to store data at the memory sub-system and to read data from the memory sub-system. The data specified by the host is hereinafter referred to as "host data" or "user data".

A host request can include logical address information (e.g., logical block address (LBA), namespace) for the host data, which is the location the host system associates with the host data and a particular zone in which to store or access the host data. The logical address information (e.g., LBA, namespace) can be part of metadata for the host data. Metadata can also include error handling data (e.g., ECC codeword, parity code), data version (e.g., used to distinguish age of data written), valid bitmap (which LBAs or logical transfer units contain valid data), etc.

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data".

"User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

A memory device can be a non-volatile memory device. A non-volatile memory device is a package of one or more dice. Each die can comprise one or more planes. For some types of non-volatile memory devices (e.g., NAND devices), each plane comprises a set of physical blocks. For some memory devices, blocks are the smallest area that can be erased. Each block comprises a set of pages. Each page comprises a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package. The memory device can be divided into one or more zones where each zone is associated with a different set of host data or user data or application.

Typical memory systems leverage superblocks which are a collection of blocks across memory planes and/or dies. Namely, each superblock can be of equal size and can include a respective collection of blocks across multiple planes and/or dies. The superblocks, when allocated, allow a controller to simultaneously write data to a large portion of memory spanning multiple blocks (across multiple planes and/or dies) with a single address.

Conventional memory sub-systems store data in memory components (e.g., blocks or superblocks) by forming partitions across portions of the memory. Specifically, the conventional memory sub-systems can start programming or storing data to an individual portion of the memory, such as a block or superblock, and associate that individual portion with a bin representing a first memory real level threshold voltage. The conventional memory sub-systems continue storing data to the individual portion and associate all of the data stored to the individual portion until a partition closing time elapses. At that point, all of the data stored in the individual portion forms a partition that is associated with the same bin and further data can no longer be written to the partition. Subsequent data that is requested to be stored is written to other partitions of the memory sub-system.

The closing time of the partitions of memory is usually predetermined and the same across all the memory blocks. The closing time is usually set based on the end of life or worst-case operations of the memory sub-system. This can lead to inefficiencies as new memory blocks can store charges more effectively for longer durations than the same blocks at the end of life of the memory sub-system. Namely, applying a one-size-fits-all approach to forming partitions can be wasteful and inefficient which ends up slowing down memory operations. This is because data can usually continue to be stored to and successfully read from the partitions long after the partitions are closed because the partitions can usually retain data for longer periods of time than those defined by the predetermined closing time. However, because the partitions are closed too early, certain blocks or portions of the memory become unusable and data can only be written to those portions after performing a PE cycle on the portion which reduces the overall life of the memory sub-systems.

Aspects of the present disclosure address the above and other deficiencies by configuring a system component, such as a memory sub-system controller, to tailor when partitions of different portions of a set of memory components are closed (e.g., the closing times of the partitions) based on memory reliability values of the portions. In this way, the duration of time that data can be written to a portion of the set of memory components before the portion is closed and the bin (e.g., representing read level threshold voltage) associated with the portion is updated is controlled based on the memory reliability value of the portion. This can reduce the number of PE cycles that are performed for the portion and improves the efficiency at which data is stored, which improves the overall efficiency of operating the memory sub-system. Namely, portions that have fewer PE cycles can be kept open to continue storing data for longer durations than other portions with greater PE cycles. As a result, the amount of blocks or portions of memory that are unusable due to closing of the portion or partition and need to undergo a PE cycle to be written to is reduced, which improves the efficiency of operating the memory sub-system.

In some embodiments, the memory controller is operatively coupled to a set of memory components and is configured to determine a memory reliability value associated with an individual portion of the set of memory components and select a partition closing time for the individual portion of the set of memory components based on the memory reliability value. The memory controller defines a partition of the individual portion of the set of memory components based on the partition closing time and associates the partition with a bin of a plurality of bins, each of the plurality of bins representing an individual read level threshold voltage against which a charge distribution of data stored in the individual portion of the set of memory components is compared to determine one or more logical values.

In some embodiments, the bin is a first bin representing a first read level threshold voltage against which the charge distribution (also referred to as Vt distribution) is compared to determine the one or more logical values. In such cases, the memory controller determines that a time interval elapsed since a collection of data was initially programmed in the partition corresponds to the partition closing time. In response to determining that the time interval has elapsed, the memory controller associates the partition with a second bin of the plurality of bins, the second bin representing a second read level threshold voltage against which the charge distribution (Vt distribution) is compared to determine the one or more logical values.

In some embodiments, the memory controller prevents additional data from being stored in the partition of the individual portion of the set of memory components in response to determining that the time interval has elapsed. The memory controller can select a set of bin scan frequencies from a plurality of sets of bin scan frequencies based on the memory reliability value associated with the individual portion of the set of memory components. The memory controller can select an individual bin scan frequency from the selected set of bin scan frequencies corresponding to the second bin and determine whether to associate the partition with a third bin of the plurality of bins instead of the second bin periodically based on the selected individual bin scan frequency. The memory controller can determine that a time interval elapsed since a collection of data was initially programmed in the partition corresponds to the partition closing time and close the partition in response to determining that the time interval elapsed to define the partition.

In some cases, the partition is a first partition. In such cases, the memory controller can receive a request to write data to the individual portion of the set of memory components after the first partition has been closed. In response to receiving the request, the memory controller writes the data to a second partition of the individual portion of the set of memory components. The memory controller can initiate a timer for the second partition in response to receiving the request and close the second partition in response to determining that the timer has reached the partition closing time corresponding to the individual portion of the set of memory components.

In some embodiments, the bin is a first bin representing a first read level threshold voltage against which the charge distribution is compared to determine the one or more logical values. In such cases, the memory controller associates the first partition with a second bin of the plurality of bins, the second bin representing a second read level threshold voltage against which the charge distribution is compared to determine the one or more logical values. The memory controller can associate the second partition with the first bin of the plurality of bins.

In some cases, the individual portion is a first portion, the memory reliability value is a first memory reliability value, and the partition closing time is a first partition closing time. In such cases, the memory controller can receive a request to write data to a second portion of the set of memory components and determine a second memory reliability value associated with the second portion of the set of memory components. The memory controller can select a second partition closing time for the second portion of the set of memory components based on the second memory reliability value. The second partition closing time can be shorter or longer than the first partition closing time. The memory controller can define a partition of the second portion of the set of memory components based on the second partition closing time and associate the partition of the second portion with the bin.

In some cases, the memory controller stores a table that associates different ranges of memory reliability values with different partition closing times. The memory controller searches the table to identify a range of memory reliability values corresponding to the memory reliability value associated with the individual portion of the set of memory components and retrieves the partition closing time from the table associated with the identified range of memory reliability values.

In some embodiments, memory reliability value represents a quantity of program-erase (PE) cycles (PECs). In some embodiments, the memory reliability value represents an age of the memory sub-system. In some embodiments, the individual portion includes a superblock that includes a plurality of memory blocks across a plurality of memory dies. In some embodiments, the memory sub-system includes a three-dimensional (3D) NAND storage device.

Though various embodiments are described herein as being implemented with respect to a memory sub-system (e.g., a controller of the memory sub-system), some or all of the portions of an embodiment can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals (e.g., download and commit firmware commands/requests) between the memory sub-system 110 and the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory.

In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), three-dimensional (3D) NAND, and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages, blocks, or superblocks that can refer to a unit (or portion) of the memory component 112 used to store data.

The memory sub-system controller 115 can communicate with the memory components 112A to 112N to perform operations such as reading data, writing data, or erasing data at the memory components 112A to 112N and other such operations. The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor 117 (processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive I/O commands or operations from the host system 120 and can convert the commands or operations into instructions or appropriate commands to achieve the desired access to the memory components 112A to 112N. The memory sub-system controller 115 can be responsible for other operations, based on instructions stored in firmware, such as wear leveling operations, garbage collection operations, error detection and ECC operations, decoding operations, encryption operations, caching operations, address translations between a logical block address and a physical block address that are associated with the memory components 112A to 112N, address translations between an application identifier received from the host system 120 and a corresponding zone of a set of zones of the memory components 112A to 112N. This can be used to restrict applications to reading and writing data only to/from a corresponding zone of the set of zones that is associated with the respective applications. In such cases, even though there may be free space elsewhere on the memory components 112A to 112N, a given application can only read/write data to/from the associated zone, such as by erasing data stored in the zone and writing new data to the zone. The memory sub-system controller 115 can further include host interface circuitry to communicate with the host system 120 via the physical host interface. The host interface circuitry can convert the I/O commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component, to communicate with the memory sub-system controller 115, and to execute memory requests (e.g., read or write) received from the memory sub-system controller 115.

In some embodiments, the memory sub-system controller 115 can include a read level threshold module 122. The read level threshold module 122 can include sense circuitry, such as sense amplifiers, configured to determine the values of data on (e.g., read), or to determine the values of data to be written to, memory cells of the set of memory components 112A to 112N. For example, in a selected string of memory cells, one or more of the sense amplifiers can read a logic level in the selected memory cell in response to a read current (charge distribution) flowing in the memory array through the selected string to the data lines. In some cases, the read current (charge distribution) is compared to a read trim value (also referred to as a read level threshold voltage) or level and based on whether the read current (charge distribution) exceeds or transgresses the read trim value, the corresponding logic level can be determined. While certain embodiments refer to a comparison to a read level threshold voltage, similar techniques can be applied to comparing the read current to a read level threshold current to determine the logic level. Over time, the current and/or voltage (charge distribution) that is stored by the string of memory cells can degrade and leak. This results in an increase in the bit error rate when the data is read using a specific trim value. To address these issues, the disclosed techniques adaptively modify the trim value based on the duration of time the data (charge distribution) has been stored by the memory cells. In some examples, the trim value is increased and in other cases the trim value is decreased. This improves the ability to accurately convert charge distributions stored by the memory cells to the logical value or logical level which reduces the bit error rate.

In order to accurately modify the trim values at the optimal or most efficient time and manner, the read level threshold module 122 can tailor when partitions of different portions of a set of memory components are closed (e.g., the closing times of the partitions) based on memory reliability values of the portions. The closing of the partitions determines which bins (e.g., trim values or read level threshold voltage values) are used to read data from the partitions and how often the bins of the partition are scanned and/or modified to improve data read operations. In this way, the duration of time that data can be written to a portion of the set of memory components before the portion is closed and the bin (e.g., representing read level threshold voltage) associated with the portion is updated is controlled based on the memory reliability value of the portion. This can reduce the number of PE cycles that are performed for the portion and improves the efficiency at which data is stored, which improves the overall efficiency of operating the memory sub-system 110. Namely, portions that have fewer PE cycles can be kept open to continue storing data for longer durations than other portions with greater PE cycles. As a result, the amount of blocks or portions of memory that are unusable due to closing of the portion or partition and that need to undergo a PE cycle to be written to is reduced, which improves the efficiency of operating the memory sub-system 110.

For example, the read level threshold module 122 can determine a memory reliability value associated with an individual portion of the set of memory components and select a partition closing time for the individual portion of the set of memory components based on the memory reliability value. The read level threshold module 122 defines a partition of the individual portion of the set of memory components based on the partition closing time and associates the partition with a bin of a plurality of bins, each of the plurality of bins representing an individual read level threshold voltage against which a charge distribution of data stored in the individual portion of the set of memory components is compared to determine one or more logical values.

Depending on the embodiment, the read level threshold module 122 can comprise logic (e.g., a set of transitory or non-transitory machine instructions, such as firmware) or one or more components that causes the memory sub-system 110 (e.g., the memory sub-system controller 115) to perform operations described herein with respect to the read level threshold module 122. The read level threshold module 122 can comprise a tangible or non-tangible unit capable of performing operations described herein.

Figure 2:
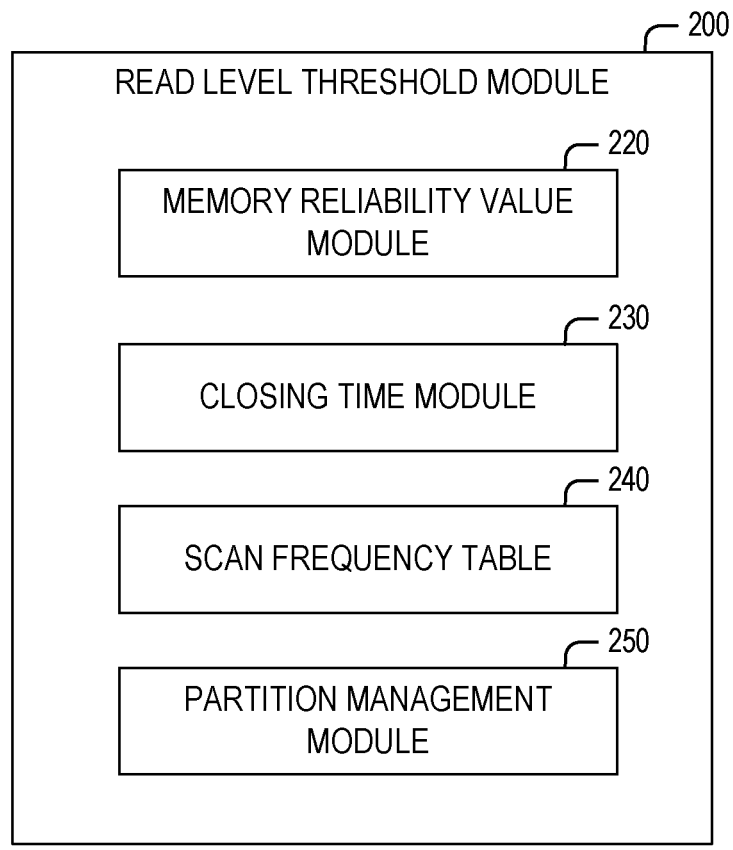
FIG. 2 is a block diagram of an example read level threshold module, in accordance with some implementations of the present disclosure.

FIG. 2 is a block diagram of an example read level threshold module 200, in accordance with some implementations of the present disclosure. The read level threshold module 200 can represent the read level threshold module 122 of FIG. 1. As illustrated, the read level threshold module 200 includes a memory reliability value module 220, a closing time module 230, a scan frequency table 240, and a partition management module 250.

The partition management module 250 can receive a request to write or program data into a portion of the set of memory components 112A to 112N. For example, the partition management module 250 can receive a request from the host system 120 to write data to a block or superblock of the set of memory components 112A to 112N. In response, the partition management module 250 can determine whether a partition of the portion of the set of memory components 112A to 112N is open or closed. If the partition is open, the partition management module 250 stores the data received in the request to one or more blocks of the portion of the set of memory components 112A to 112N. The partition management module 250 continues writing data to the same partition until the partition is closed. Any data that is written to the same partition is associated with a same bin. The bin can define or represent a read level threshold voltage that is used to read a charge distribution stored in the partition to determine the corresponding logical value or level.

The partition management module 250 can access a timer associated with the partition and compare the timer to a closing time for the partition. For example, the partition management module 250 can communicate with the memory reliability value module 220 to obtain a memory reliability value for the portion of the set of memory components 112A to 112N that includes the partition. The memory reliability value module 220 can store a table, such as the table 300 shown in FIG. 3, that associates different memory reliability values with different closing times. As an example, a memory reliability value row 310 can store different memory reliability values, such as different ranges of PE cycle counts. Each of the different memory reliability values of the memory reliability value row 310 can be associated with a different closing time 320.

For example, a PE cycle count of 0 (meaning the block or superblock has never been erased) can be associated with a maximum closing time 320 of 4 hours. Once the particular portion of the set of memory components 112A to 112N is erased a certain number of times (e.g., 1200), the memory reliability value module 220 can determine that the portion falls within a second range of 1-2000 PEC (program-erase cycles), which is associated with a 3-hour closing time. The maximum memory reliability value of, for example, 4000 PECs or more, can be associated with the smallest closing time 320 of 1 hour.

The closing time module 230 can receive or determine the memory reliability value of the portion of the set of memory components 112A to 112N that is being requested to be written to by the host system 120. For example, the closing time module 230 can determine the PEC of the superblock to which the host system 120 requests to write data and can retrieve the corresponding closing time 320. The closing time module 230 can provide the retrieved closing time 320 to the partition management module 250. In response, the partition management module 250 obtains a timestamp of a partition of the portion of the set of memory components 112A to 112N representing when a collection of data was initially written to the partition for the first time. The partition management module 250 can compute a difference between the timestamp and the current time to determine a duration representing how long the partition has been opened since the collection of data was initially written. In response to determining that the duration is less than the closing time 320 associated with the portion of the set of memory components 112A to 112N, the partition management module 250 continues writing new data to the same partition and continues to associate the partition with a first bin. The first bin can represent a first read level threshold voltage against which a charge distribution is compared to determine or derive a corresponding logical or logic value or level. In response to determining that the duration is greater than the closing time 320 associated with the portion of the set of memory components 112A to 112N, the partition management module 250 closes the partition and prevents new data from being written to the closed partition.

In another example, the partition management module 250 can start a timer when a collection of data is initially written to the partition for the first time. The partition management module 250 can compare the current timer value to the closing time 320. In response to determining that the timer fails to transgress the closing time 320 associated with the portion of the set of memory components 112A to 112N, the partition management module 250 continues writing new data to the same partition and continues to associate the partition with a first bin. The first bin can represent a first read level threshold voltage against which a charge distribution is compared to determine or derive a corresponding logical or logic value or level. In response to determining that the timer transgresses the closing time 320 associated with the portion of the set of memory components 112A to 112N, the partition management module 250 closes the partition and prevents new data from being written to the closed partition.

All the data that has been stored in the closed partition can be associated with the same bin (e.g., the first bin) until the partition management module 250 determines the need to associate the closed partition with a new bin (e.g., a second bin), such as after a threshold period of time. In some examples, data that is stored in the partition can be read from the partition using a first bin (e.g., a first read threshold voltage) until the partition is closed. Once the partition is closed, the data can be read from the partition using a second bin (e.g., a second read threshold voltage). In some cases, the transition from associating the partition with one bin to another can be controlled based on the scan frequency table 240. Specifically, data stored in the partition can initially be read using the first bin 420 of the table 400 shown in FIG. 4. Once the data has been retained by the partition beyond the time associated with the first bin 420, the partition is associated with a second bin 430 and data stored in the partition is then read using the second bin 430. Once the data has been retained by the partition beyond the time associated with the second bin 430, the partition is associated with a third bin 440 and data stored in the partition is then read using the third bin 440.

In some examples, rather and/or in addition to automatically associating partitions with different bins based on the data retention periods, the partition management module 250 analyzes the closed partitions periodically to determine whether to continue associating the partition with a current bin or to associate the partition with a new bin. For example, the partition management module 250 can communicate with the scan frequency table 240 to obtain the frequency or period at which the charge distribution stored in the partition is analyzed to determine whether or not to associate the partition with a new bin.

The scan frequency table 240 can store a table 400 as shown in FIG. 4. The table 400 can associate different memory reliability values (e.g., PEC 410) with different sets of bin scan frequencies. The table 400 can list a set of different bins (e.g., a first bin 420, a second bin 430, a third bin 440, and a fourth bin 450). For each bin, the table 400 indicates the periodicity or frequency that is used to determine whether to update the bin associated with a particular partition. For example, the partition management module 250 can indicate to the scan frequency table 240 that a partition is included in a portion of the set of memory components 112A to 112N that includes 0 PEC. In response, the scan frequency table 240 can identify a row 412 corresponding to the indicated PEC value. The row 412 includes a set of bin scan frequencies of different bins. For example, for a 0 PEC, the table 240 can indicate that an association with the first bin 420 corresponds to a 60-minute bin scan frequency, an association with the second bin 430 corresponds to a 2-hour bin scan frequency, an association with the third bin 440 corresponds to a 4-hour bin scan frequency, and an association with the fourth bin 450 corresponds to a 10-hour bin scan frequency.

In response to receiving the set of bin scan frequencies for the portion of the set of memory components 112A to 112N, the partition management module 250 can determine the current bin associated with the partition that has been closed. The partition management module 250 can initiate a timer when the partition is closed and retrieve the bin scan frequency from the set of bin scan frequencies corresponding to the current bin. For example, if the current bin is the first bin 420, the partition management module 250 can determine that the bin scan frequency is 60 minutes. In such cases, the partition management module 250 can compare the timer to the determined bin scan frequency. If the timer transgresses or corresponds to the bin scan frequency, the partition management module 250 can access the charge distribution of charges stored by the partition and can determine whether to update the current bin to the next bin. For example, if the current bin associated with the partition results in a bit error rate that transgresses a threshold, the partition management module 250 can associate the partition with the second bin 430 instead of the first bin 420. The second bin 430 can represent a second read threshold voltage level that is greater or smaller than the read threshold voltage level of the first bin 420. In response, the collection of data stored in the partition is read using the read threshold voltage level of the second bin 430 instead of the first bin 420.

In some examples, the partition management module 250 receives a request to write data to the same portion of the set of memory components 112A to 112N that includes the closed partition. For example, the host system 120 can request to write additional data to the same superblock that includes the previously closed partition. In response, the partition management module 250 can start writing the data to a new partition and initiate a timer for the new partition to determine when to close the new partition. The partition management module 250 can associate the new partition with the first bin 420 and can associate the closed partition with the second bin 430. In this way, the partition management module 250 can read data from the closed partition using the second read level threshold voltage corresponding to the second bin 430 and can read data from the new partition using the first read level threshold voltage corresponding to the first bin 420.

The partition management module 250 can continue writing subsequent data sets to the new partition and reading data from the new partition according to the first bin 420 associated with the new partition until the closing time 320 of the new partition is reached. In some cases, because the new partition is part of the same portion of the set of memory components 112A to 112N as the previously closed partition, the new partition is associated with the same memory reliability value as the closed partition. As such, the partition management module 250 can associate the same closing time 320 with the new partition and can close the new partition when the duration of time or the data retention period from when the data was first written to the new partition reaches the closing time. At this point, as previously discussed, the partition management module 250 can associate the new partition with a new bin to read data stored in the new partition using a different read level threshold voltage.

In some examples, the partition management module 250 receives a request to write data to a second portion of the set of memory components 112A to 112N. For example, the host system 120 can request to write additional data to a second superblock. In response, the partition management module 250 can start writing the data to a new partition of the second portion of the set of memory components 112A to 112N and initiate a timer for the new partition to determine when to close the new partition. The partition management module 250 can associate the new partition with the first bin 420.

The partition management module 250 can continue writing subsequent data sets to the new partition and reading data from the new partition according to the first bin 420 associated with the new partition until the closing time 320 of the new partition is reached. In some cases, the partition management module 250 obtains the closing time 320 for the new partition based on the memory reliability value of the second portion of the set of memory components 112A to 112N. The memory reliability value can differ from that of the portion (e.g., a first superblock) of the set of memory components 112A to 112N previously discussed that includes the first and second partitions. As such, the closing time 320 can differ from the closing time of the partitions of the previously discussed portion (e.g., the first superblock). The partition management module 250 can obtain the closing time 320 by searching the ranges of memory reliability value row 310 stored in the table 300 for a range that corresponds to the memory reliability value of the second portion of the set of memory components 112A to 112N. For example, the second portion can include 3000 PEC, which corresponds to a 2-hour closing time 320 according to the table 300. In such cases, the partition management module 250 can continue reading data from the new partition of the second portion using the first bin 420 until the 2-hour closing time 320. At that point, the partition management module 250 closes the new partition and can associate the new partition of the second portion with a second bin 430.

In this way, different portions of the set of memory components 112A to 112N can be associated with different bins on the basis of their respective memory reliability values. Namely, a collection of data can be stored in a first portion and new data can continue to be stored in the first portion until a first closing time (e.g., 3 hours) corresponding to the memory reliability value of the first portion is reached. The collection of data can continue being read from the first portion using the first bin 420 until the first closing time is reached. At that point, further data is no longer stored in the first portion and the collection of data is read using the second bin 430 until a time period (e.g., 2 hours) for transitioning the first portion to a new bin associated with the second bin 430 is reached. At that point, the first portion is transitioned to be associated with the third bin 440. Similarly, a collection of data can be stored in a second portion and new data can continue to be stored in the second portion until a second closing time (e.g., 2 hours) corresponding to the memory reliability value of the second portion is reached. The collection of data can continue being read from the second portion using the first bin 420 until the second closing time is reached. At that point, further data is no longer stored in the second portion and the collection of data is read using the second bin 430 until the time period (e.g., 2 hours) for transitioning the second portion to a new bin associated with the second bin 430 is reached. At that point, the second portion is transitioned to be associated with the third bin 440.

Figure 5:
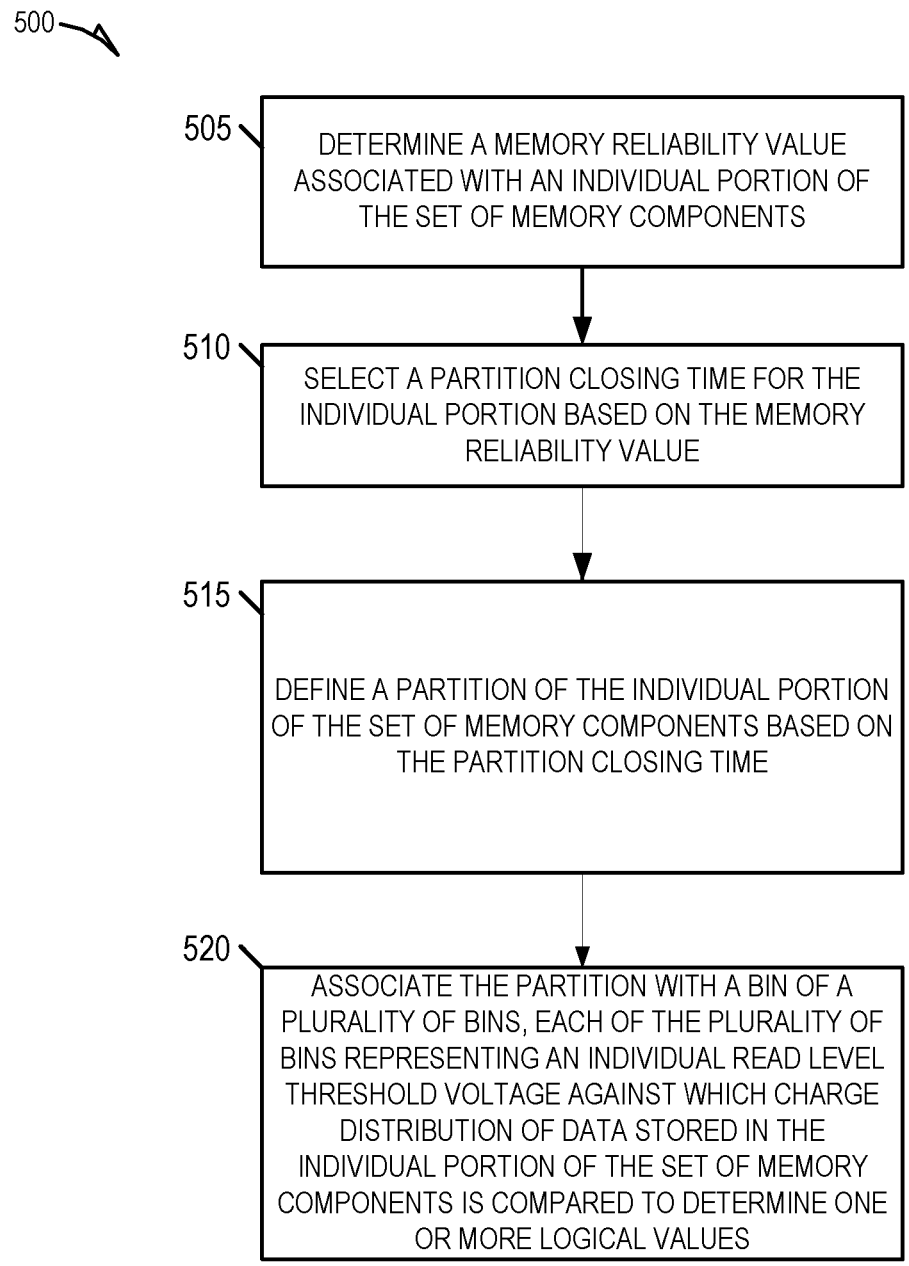
FIG. 5 is a flow diagram of an example method to perform adaptive read level threshold voltage operations, in accordance with some implementations of the present disclosure.

FIG. 5 is a flow diagram of an example method 500 to perform adaptive read level threshold voltage operations, in accordance with some implementations of the present disclosure. Method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 500 is performed by the memory sub-system controller 115 or subcomponents of the controller 115 of FIG. 1. In these embodiments, the method 500 can be performed, at least in part, by the read level threshold module 200. Although the processes are shown in a particular sequence or order, unless otherwise specified, the order of the processes can be modified. Thus, the illustrated embodiments should be understood only as examples; the illustrated processes can be performed in a different order, and some processes can be performed in parallel. Additionally, one or more processes can be omitted in various embodiments. Thus, not all processes are required in every embodiment. Other process flows are possible.

Referring now to FIG. 5, the method (or process) 500 begins at operation 505, with the read level threshold module 200 of a memory sub-system (e.g., of processor of the memory sub-system controller 115) determining a memory reliability value (e.g., PEC or PE count) associated with an individual portion of the set of memory components. Then, at operation 510, the read level threshold module 200 selects a partition closing time for the individual portion of the set of memory components based on the memory reliability value. The read level threshold module 200, at operation 515, defines a partition of the individual portion of the set of memory components based on the partition closing time and, at operation 520, associates the partition with a bin of a plurality of bins, each of the plurality of bins representing an individual read level threshold voltage against which charge distribution of data stored in the individual portion of the set of memory components is compared to determine one or more logical values.

In view of the disclosure above, various examples are set forth below. It should be noted that one or more features of an example, taken in isolation or combination, should be considered within the disclosure of this application.

Example 1: a system comprising: a memory sub-system comprising a set of memory components; and a processing device, operatively coupled to the set of memory components and configured to operations comprising: determining a memory reliability value associated with an individual portion of the set of memory components; selecting a partition closing time for the individual portion of the set of memory components based on the memory reliability value; defining a partition of the individual portion of the set of memory components based on the partition closing time; and associating the partition with a bin of a plurality of bins, each of the plurality of bins representing an individual read level threshold voltage against which a charge distribution of data stored in the individual portion of the set of memory components is compared to determine one or more logical values.

Example 2, the system of Example 1 wherein the bin is a first bin representing a first read level threshold voltage against which the charge distribution is compared to determine the one or more logical values, and wherein the operations comprise: determining that a time interval elapsed since a collection of data was initially programmed in the partition corresponds to the partition closing time; and in response to determining that the time interval has elapsed, associating the partition with a second bin of the plurality of bins, the second bin representing a second read level threshold voltage against which the charge distribution is compared to determine the one or more logical values.

Example 3, the system of Example 2, wherein the operations comprise: preventing additional data from being stored in the partition of the individual portion of the set of memory components in response to determining that the time interval has elapsed.

Example 4, the system of any one of Examples 1-3, wherein the operations comprise: selecting a set of bin scan frequencies from a plurality of sets of bin scan frequencies based on the memory reliability value associated with the individual portion of the set of memory components.

Example 5, the system of Example 4, wherein the operations comprise: selecting an individual bin scan frequency from the selected set of bin scan frequencies corresponding to the second bin; and determining whether to associate the partition with a third bin of the plurality of bins instead of the second bin periodically based on the selected individual bin scan frequency.

Example 6, the system of any one of Examples 1-5, wherein the operations comprise: determining that a time interval elapsed since a collection of data was initially programmed in the partition corresponds to the partition closing time; and closing the partition in response to determining that the time interval elapsed to define the partition.

Example 7, the system of Example 6, wherein the partition is a first partition, and wherein the operations comprise: receiving a request to write data to the individual portion of the set of memory components after the first partition has been closed; and in response to receiving the request, writing the data to a second partition of the individual portion of the set of memory components.

Example 8, the system of Example 7, wherein the operations comprise: initiating a timer for the second partition in response to receiving the request; and closing the second partition in response to determining that the timer has reached the partition closing time corresponding to the individual portion of the set of memory components.

Example 9, the system of Example 8, wherein the bin is a first bin representing a first read level threshold voltage against which the charge distribution is compared to determine the one or more logical values, and wherein the operations comprise: associating the first partition with a second bin of the plurality of bins, the second bin representing a second read level threshold voltage against which the charge distribution is compared to determine the one or more logical values; and associating the second partition with the first bin of the plurality of bins.

Example 10, the system of any one of Examples 1-9, wherein the individual portion is a first portion, wherein the memory reliability value is a first memory reliability value, wherein the partition closing time is a first partition closing time, and wherein the operations comprise: receiving a request to write data to a second portion of the set of memory components; determining a second memory reliability value associated with the second portion of the set of memory components; and selecting a second partition closing time for the second portion of the set of memory components based on the second memory reliability value.

Example 11, the system of Example 10, wherein the second partition closing time is shorter than the first partition closing time.

Example 12, the system of any one of Examples 1-11, wherein the operations comprise: defining a partition of the second portion of the set of memory components based on the second partition closing time; and associating the partition of the second portion with the bin.

Example 13, the system of any one of Examples 1-12, wherein the memory reliability value represents a quantity of program-erase (PE) cycles (PECs).

Example 14, the system of any one of Examples 1-13, wherein the memory reliability value represents an age of the memory sub-system.

Example 15, the system of any one of Examples 1-14, wherein the individual portion includes a superblock comprising a plurality of memory blocks across a plurality of memory dies.

Example 16, the system of any one of Examples 1-15, wherein the memory sub-system comprises a three-dimensional (3D) NAND storage device.

Example 17, the system of any one of Examples 1-16, wherein the operations comprise: storing a table that associates different ranges of memory reliability values with different partition closing times.

Example 18, the system of Example 17, wherein the operations comprise: searching the table to identify a range of memory reliability values corresponding to the memory reliability value associated with the individual portion of the set of memory components; and retrieving the partition closing time from the table associated with the identified range of memory reliability values.

Methods and computer-readable storage medium with instructions for performing any one of the above Examples.

Figure 6:
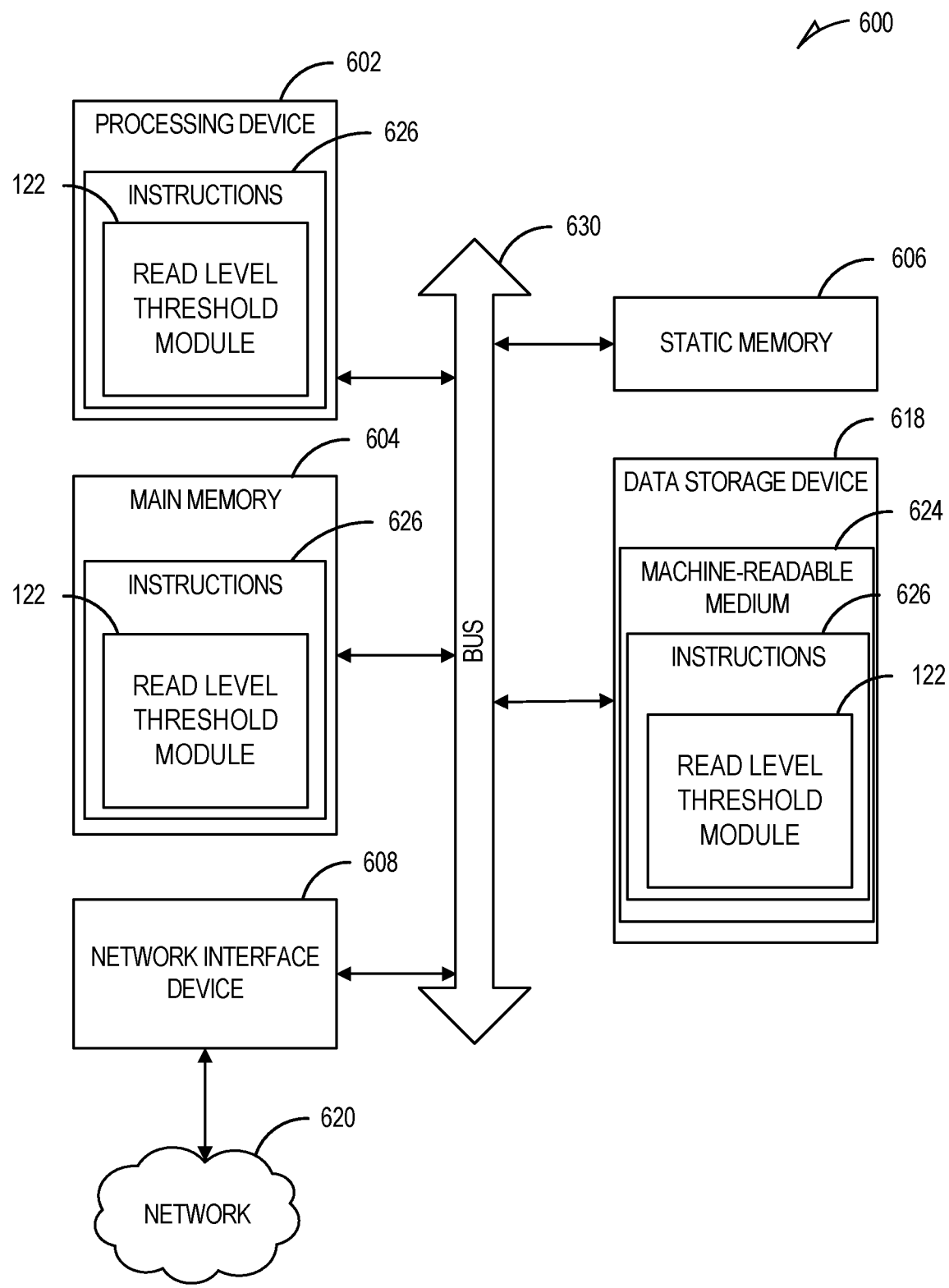
FIG. 6 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read level threshold module 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the read level threshold module 122 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the embodiments of the disclosure as set forth in the following claims. The specification and drawings are, accordingly, to be regarded in an illustrative sense rather than a restrictive sense.

What is claimed is:

1. A system comprising:
a memory sub-system comprising a set of memory components; and
a processing device, operatively coupled to the set of memory components and configured to perform operations comprising:
determining a memory reliability value associated with an individual portion of the set of memory components;
storing data that associates different ranges of memory reliability values with different partition closing times;
selecting, based on the stored data, a partition closing time for the individual portion of the set of memory components based on the memory reliability value;
defining a partition of the individual portion of the set of memory components based on the partition closing time; and
associating the partition with a bin of a plurality of bins, each of the plurality of bins representing an individual read level threshold voltage against which a charge distribution of data stored in the individual portion of the set of memory components is compared to determine one or more logical values.

2. The system of claim 1, wherein the bin is a first bin representing a first read level threshold voltage against which the charge distribution is compared to determine the one or more logical values, and wherein the operations comprise:
determining that a time interval elapsed since a collection of data was initially programmed in the partition corresponds to the partition closing time; and
in response to determining that the time interval has elapsed, associating the partition with a second bin of the plurality of bins, the second bin representing a second read level threshold voltage against which the charge distribution is compared to determine the one or more logical values.

3. The system of claim 2, wherein the operations comprise:
preventing additional data from being stored in the partition of the individual portion of the set of memory components in response to determining that the time interval has elapsed.

4. The system of claim 2, wherein the operations comprise:
selecting a set of bin scan frequencies from a plurality of sets of bin scan frequencies based on the memory reliability value associated with the individual portion of the set of memory components.

5. The system of claim 4, wherein the operations comprise:
selecting an individual bin scan frequency from the selected set of bin scan frequencies corresponding to the second bin; and
determining whether to associate the partition with a third bin of the plurality of bins instead of the second bin periodically based on the selected individual bin scan frequency.

6. The system of claim 1, wherein the operations comprise:
determining that a time interval elapsed since a collection of data was initially programmed in the partition corresponds to the partition closing time; and
closing the partition in response to determining that the time interval elapsed to define the partition.

7. The system of claim 6, wherein the partition is a first partition, and wherein the operations comprise:
receiving a request to write data to the individual portion of the set of memory components after the first partition has been closed; and
in response to receiving the request, writing the data to a second partition of the individual portion of the set of memory components.

8. The system of claim 7, wherein the operations comprise:
initiating a timer for the second partition in response to receiving the request; and
closing the second partition in response to determining that the timer has reached the partition closing time corresponding to the individual portion of the set of memory components.

9. The system of claim 8, wherein the bin is a first bin representing a first read level threshold voltage against which the charge distribution is compared to determine the one or more logical values, and wherein the operations comprise:
associating the first partition with a second bin of the plurality of bins, the second bin representing a second read level threshold voltage against which the charge distribution is compared to determine the one or more logical values; and
associating the second partition with the first bin of the plurality of bins.

10. The system of claim 1, wherein the individual portion is a first portion, wherein the memory reliability value is a first memory reliability value, wherein the partition closing time is a first partition closing time, and wherein the operations comprise:
receiving a request to write data to a second portion of the set of memory components;
determining a second memory reliability value associated with the second portion of the set of memory components; and
selecting a second partition closing time for the second portion of the set of memory components based on the second memory reliability value.

11. The system of claim 10, wherein the second partition closing time is shorter than the first partition closing time.

12. The system of claim 10, wherein the operations comprise:
defining a partition of the second portion of the set of memory components based on the second partition closing time; and
associating the partition of the second portion with the bin.

13. The system of claim 1, wherein the memory reliability value represents a quantity of program-erase (PE) cycles (PECs).

14. The system of claim 1, wherein the memory reliability value represents an age of the memory sub-system.

15. The system of claim 1, wherein the individual portion includes a superblock comprising a plurality of memory blocks across a plurality of memory dies.

16. The system of claim 1, wherein the memory sub-system comprises a three-dimensional (3D) NAND storage device.

17. The system of claim 1, wherein the operations comprise:
searching the data to identify a range of memory reliability values corresponding to the memory reliability value associated with the individual portion of the set of memory components; and
retrieving the partition closing time from the data associated with the identified range of memory reliability values.

18. A method comprising:
determining a memory reliability value associated with an individual portion of a set of memory components;
storing data that associates different ranges of memory reliability values with different partition closing times;
selecting, based on the stored data, a partition closing time for the individual portion of the set of memory components based on the memory reliability value;
defining a partition of the individual portion of the set of memory components based on the partition closing time; and
associating the partition with a bin of a plurality of bins, each of the plurality of bins representing an individual read level threshold voltage against which charge distribution of data stored in the individual portion of the set of memory components is compared to determine one or more logical values.

19. A non-transitory computer-readable storage medium comprising instructions that, when executed by a processing device, cause the processing device to perform operations comprising:
determining a memory reliability value associated with an individual portion of a set of memory components;
storing data that associates different ranges of memory reliability values with different partition closing times;
selecting, based on the stored data, a partition closing time for the individual portion of the set of memory components based on the memory reliability value;
defining a partition of the individual portion of the set of memory components based on the partition closing time; and
associating the partition with a bin of a plurality of bins, each of the plurality of bins representing an individual read level threshold voltage against which charge distribution of data stored in the individual portion of the set of memory components is compared to determine one or more logical values.

20. The non-transitory computer-readable storage medium of claim 19, wherein the set of memory components comprises a three-dimensional (3D) NAND storage device.

* * * * *